United States Patent
Fukuda et al.

(10) Patent No.: US 8,311,157 B2
(45) Date of Patent: Nov. 13, 2012

(54) SIGNAL RECOVERY CIRCUIT

(75) Inventors: Koji Fukuda, Fuchu (JP); Hiroki Yamashita, Hachioji (JP); Daisuke Hamano, Hachioji (JP)

(73) Assignee: Hitachi, Ltd., Tokyo (JP)

(*) Notice: Subject to any disclaimer, the term of this patent is extended or adjusted under 35 U.S.C. 154(b) by 935 days.

(21) Appl. No.: 12/320,409

(22) Filed: Jan. 26, 2009

(65) Prior Publication Data
US 2009/0231001 A1 Sep. 17, 2009

(30) Foreign Application Priority Data

Mar. 11, 2008 (JP) .................... 2008-061663

(51) Int. Cl.
*H04L 27/00* (2006.01)
(52) U.S. Cl. ........ 375/326; 375/371; 375/373; 375/375; 375/376; 327/147; 327/156
(58) Field of Classification Search .............. 375/326, 375/371–376; 327/147–163
See application file for complete search history.

(56) References Cited

U.S. PATENT DOCUMENTS
2004/0114632 A1 6/2004 Yuuki et al.
2005/0046456 A1* 3/2005 d'Haene et al. ............ 327/165
2005/0110542 A1* 5/2005 Byun ......................... 327/158

FOREIGN PATENT DOCUMENTS
JP 2004180188 A 6/2004
* cited by examiner

*Primary Examiner* — Curtis Odom
(74) *Attorney, Agent, or Firm* — Stites & Harbison, PLLC; Juan Carlos A. Marquez, Esq

(57) ABSTRACT

A signal recovery circuit capable of expanding the receive margin is provided. The signal recovery circuit comprises for example a clock generator unit CLK_GEN for generating the clock signals CLKa, CLKb, and CLKc, a window width control unit WW_CTL, and a clock data discriminator unit CD_JGE for generating a phase detector signal (EARLY, LATE) when for example a data signal Di pulse edge enters between the CLKa and CLKb, or between the CLKb and CLKc, and the clock generator unit. Along with exerting control based on these phase detection signals to maintain the mutual phase differential of the overall phase of CLKa, CLKb, CLKc so as to prevent intrusion of the above described Di edge, the CLK_GEN also regulates the phase differential between CLKa and CLKb, and the phase differential between CLKb and CLKc based on a signal (Sww) from the WW_CTL.

12 Claims, 11 Drawing Sheets

CD_JGE: CLOCK-DATA DISCRIMINATOR UNIT
CLK_GEN: CLOCK GENERATOR UNIT
FIL_BK: AVERAGING UNIT
WW_CTL: WINDOW WIDTH CONTROL UNIT

CD_JGE: CLOCK-DATA DISCRIMINATOR UNIT
CLK_GEN: CLOCK GENERATOR UNIT
FIL_BK: AVERAGING UNIT
WW_CTL: WINDOW WIDTH CONTROL UNIT

SIGNAL RECOVERY CIRCUIT

CLAIM OF PRIORITY

The present application claims priority from Japanese patent application JP 2008-061663 filed on Mar. 11, 2008, the content of which is hereby incorporated by reference into this application.

FIELD OF THE INVENTION

The present invention relates to a signal recovery circuit, and relates in particular to technology for a clock data recovery (CDR) circuit effective for phase comparison utilizing the eye track method.

BACKGROUND OF THE INVENTION

The patent document JP-A 2004-180188 for example shows a clock data recovery circuit capable of expanding the jitter tolerance, etc. This clock data recovery circuit compares the data edge and the clock edge, and recovers the clock data by separating the clock edge from the data edge if the gap between the data edge and clock edge falls below the standard value.

SUMMARY OF THE INVENTION

The inventors are also submitting a Japanese Patent Application No. 2006-305379 that not publicly known and is prior to this application (hereafter also called the reference document 1). The reference document 1 and JP-A 2004-180188 recover clock signals by utilizing an eye track method phase comparator, and not the generally used Alexander type (edge alignment method) phase comparator. FIG. 13 shows an overview of phase comparison by the eye track method in the signal recovery circuit assumed for use in this invention. FIG. 13A is a concept view showing the structure of the main section of this invention and FIG. 13B is a descriptive drawing showing an example of the operation of that section.

In the eye track method as shown in FIG. 13B a clock signal CLKb edge for code identification is set near the center of the EYE (data output region) of the so-called eye pattern for the received data signal Di. The clock signal CLKa and CLKc edges for phase comparison are set before and after the clock signal CLKb edge. The clock signal CLKa, CLKb, CLKc phases are shifted forward and backward while maintaining their mutual phase differential to prevent the switching edge EG of data Di from intruding between the CLKa edge and the CLKc edge, and the CLKb edge is in this way always maintained near the center of the eye. In the typical edge alignment method, the clock signal edge is set in the switching edge EG of Di; and the code identification clock signal edges are constantly set at points at fixed intervals from this clock signal.

To implement this operation, the clock data discriminator unit CD_JGE shown in FIG. 13A contains the flip flop circuits (latch circuits) FF91-FF93 and the exclusive circuits EOR91, 92. The FF91, FF92, FF93 latch the received data Di at each edge of the clock signals CLKa, CLKb and CLKc. The latch results from CLKb (output from FF92) form the recovery data signal Dr. The EOR 91 outputs an early signal (EARLY signal) when the latch results from FF91 and FF92 are different. The EOR92 outputs a late signal (LATE signal) when the latch results from FF92 and FF93 are different.

In other words as shown in FIG. 13B, the EOR91 circuit outputs an EARLY signal when the Di front side edge EG enters between the CLKa and the CLKb. The EOR92 outputs a LATE signal when the Di rear side edge enters between the CLKb and the CLKc. Though not shown in the drawing, the CLKa, CLKb, and CLKc pulses are delayed overall when the EARLY signal was output (shifted to the right in FIG. 13B); and the CLKa, CLKb, and CLKc pulses are advanced overall when the LATE signal was output (shifted to the left side in FIG. 13B).

This type of eye track method offers the advantage of excellent high-frequency jitter tolerance and low-frequency wander follow-up compared to the edge alignment method. However the eye track method utilizes the stochastic resonance phenomenon so that phase detection performance is maximum when the probability that the edge EG of receive data Di will enter within the eye track window width (for example, between edge of CLKa and edge of CLKc) is a certain value. The phase detection performance deteriorates if the edge intrusion probability is smaller than or larger than that optimum edge intrusion probability.

The pattern jitter on the other hand which makes up most of the jitter contained in the receive data signal Di, changes greatly with the transmission line loss (roughly equal to length). FIG. 14 is drawings for describing problems with the background art. FIG. 14A and FIG. 14B respectively show examples of eye patterns for receive data signals when using respectively different transmission paths. Namely, the pattern jitter becomes smaller when the transmission line loss is small as shown in FIG. 14A; and the pattern jitter becomes large when the transmission line loss is larger as shown in FIG. 14B.

However, the eye track window width WW in the conventional art is a fixed width so that transmission line losses (equivalent to length) occur when the eye track window width WW is too narrow (see for example FIG. 14A) or too wide (see for example FIG. 14B). If the eye track window width WW is too narrow then the code identification clock signal CLKb is fixed at a position inclined to the front or rear rather than the vicinity of the eye center so that situations occur for example where code identification is made at positions with a small Di amplitude margin or where a suitable phase recovery clock cannot be obtained. On the other hand if the eye track window width WW is too wide, then the clock signal CLKb position cannot stabilize because the EARLY signal and the LATE signal are generated simultaneously so that clock recovery and data recovery operations are also unstable. Due to these circumstances, the background art therefore has the problem that a drop in the receive margin and therefore a drop in the BER (Bit Error Rate) may occur.

Whereupon one object of the present invention is to provide a signal recovery circuit capable of expanding the receive margin. Other objects and unique features of this invention will be apparent from the description in these specifications and from the attached drawings.

A brief overview of the typical aspects of the invention disclosed in this application is given next.

The signal recovery circuit of a first aspect of this invention controls the phase of each clock edge so that the data signal edge enters at a specified frequency (rate of occurrence) within the window formed by the period between the code identification clock edge and the phase comparison clock edge. More specifically, this signal recovery circuit includes a first scheme to control the phase of each clock edge when the data signal edge has entered the window, so that the window is made to move away from the edge of the data signal while still maintaining the window width; and a second unit to change the width of the window according to the setting signal. By making the data signal edge enter within the window at a specified frequency, the code identification clock edge can be set to an optimal position, the receive margin can be expanded, and the BER therefore improved.

The setting signal for deciding the window width may here be a signal from an external source or may be a signal generated by an internal circuit. In other words, the window width can be set to a roughly optimal value according to the transmission path length, so that an external source can input a value expressing the transmission path length, or an internal circuit can be used to measure this transmission path length. Preferably however in order to obtain an even more accurate optimal value for window length, a scheme utilizing an internal circuit to search for an optimal window width while actually measuring the frequency that the data signal edge enters within the window; or a scheme to search for an optimal window width while measuring the BER are employed. The receive margin can in this way be expanded and BER even further improved.

The phase comparison clock edge is usually set as a front edge and a rear edge enclosing the code identification clock edge. The width of the front window formed from this front edge and code identification clock edge; and the width of the rear window formed from the rear edge and code identification clock edge may be mutually linked and set to the same value, or may both be set to separate optional values. This latter case allows matching with the largest position even when the code identification clock edge position where the receive margin is largest is not at the theoretical center of the eye pattern. The receive margin can in this way be expanded and the BER further improved.

Expressed briefly, a typical effect of the invention as disclosed in this application renders a signal recovery circuit capable of expanding the receive margin.

In the following embodiments where required for purposes of simplicity, the description is subdivided into multiple sections or embodiments. However unless specified otherwise, those sections or embodiments are not mutually unrelated and one section is related as a variation, detailed description or supplemental description in part or in whole. Moreover, when an element quantity (including the unit quantity, numerical value, amount, range, etc.) is cited in the following embodiments; unless explicitly specified, or basically and clearly limited to a specific quantity, the embodiments are not restricted to a specific quantity and may be more or less than that specified quantity.

Also, needless to say, the structural elements in the following embodiments, (including element steps) are not always essential unless explicitly specified, or basically and clearly specified as required. In the same way, when the shape and positional relation of the structural elements are described in the following embodiments, then that description essentially includes close or similar shapes, unless explicitly specified, or basically and clearly specified to the contrary. The above numerical values and ranges are also regarded in the same way.

BRIEF DESCRIPTION OF THE DRAWINGS

FIG. 3 is drawings showing another example of the clock generator unit of FIG. 1.

FIG. 4 is drawings showing respective examples of the phase interpolation circuits in FIG. 2 and FIG. 3.

FIG. 11 is drawings showing the signal recovery circuit of the sixth embodiment of this invention.

FIG. 13 is drawings showing an overview of phase comparison with the eye track method in the signal recovery circuit evaluated as a precondition for this invention; FIG. 14A and FIG. 14B are respectively drawings for describing examples of the eye patterns for the receive data signal when utilizing respectively different transmission paths.

DETAILED DESCRIPTION OF THE PREFERRED EMBODIMENTS

Figure 1:
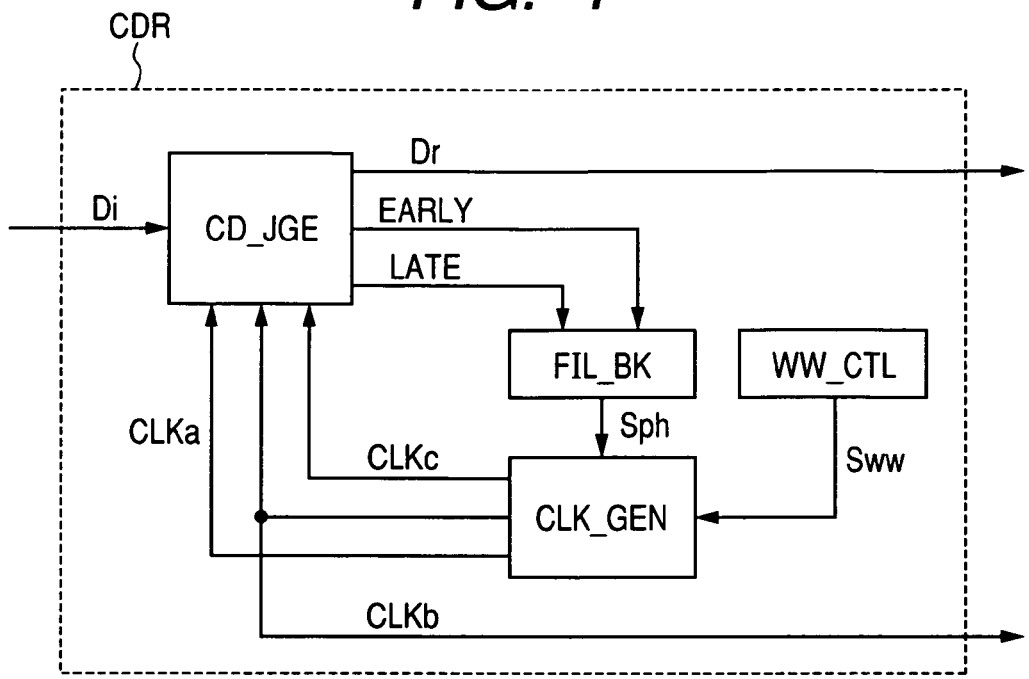
FIG. 1 is a block diagram showing one example of the structure of the signal recovery circuit of the first embodiment of this invention.

The embodiments of this invention are hereinafter described while referring to the drawings. In all drawings for describing the embodiments, identical reference numerals are assigned to the same members, and redundant descriptions of those members are omitted.

First Embodiment

FIG. 1 is a block diagram showing one example of the structure of the signal recovery circuit of the first embodiment of this invention. The signal recovery circuit (clock data recovery circuit) CDR of FIG. 1 contains a window width control unit WW_CTL in addition to the clock data discriminator unit CD_JGE, an averaging unit FIL_BK, and a clock generator unit CLK_GEN. Though not shown in the drawing, the CDR in FIG. 1, is contained in a portion of the receive circuit within a transmit system made up of a transmit circuit and a receive circuit and a transmission line connecting to those circuits.

Figure 13A:
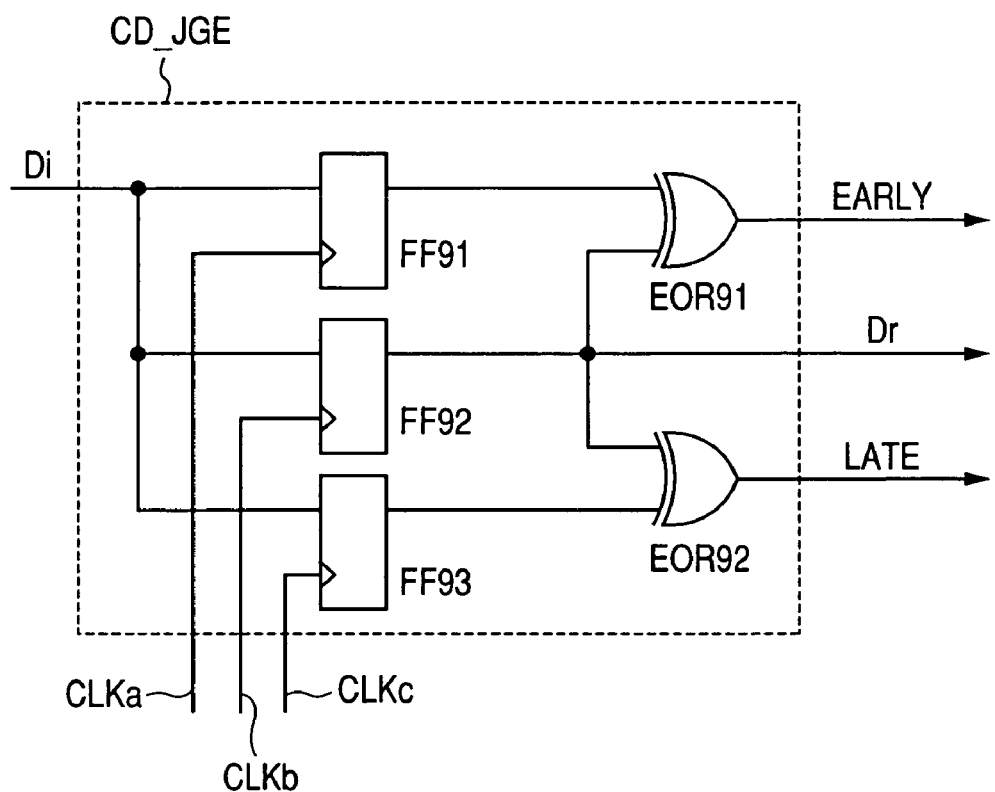
FIG. 13A is a concept view showing the structure of that major section.
Figure 13B:
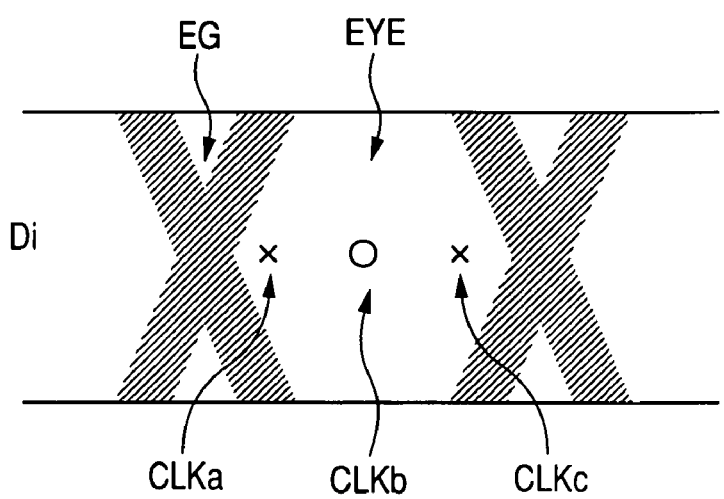
FIG. 13B is a drawing for describing an example of that operation.
Figure 14A:
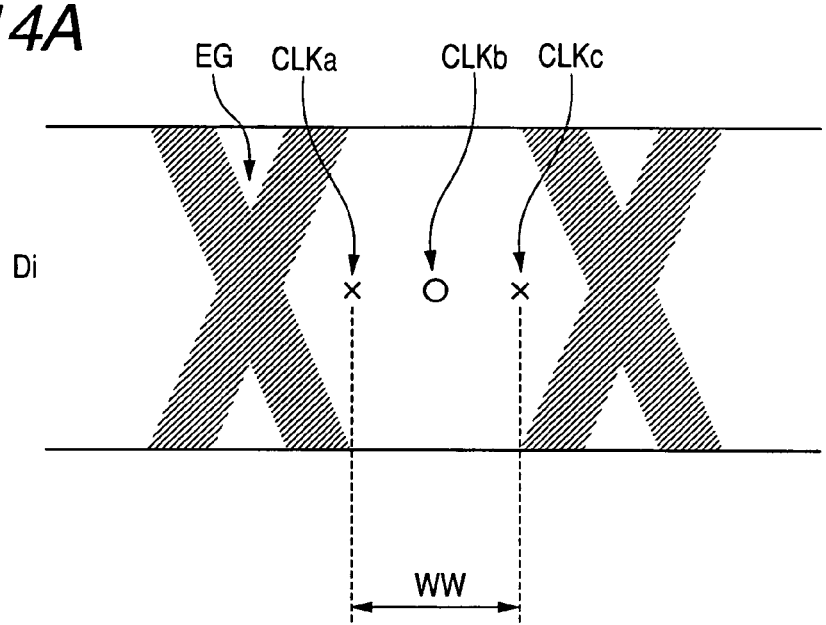
FIG. 14A and FIG. 14B are drawings for describing the problem points of the related art.
Figure 14B:
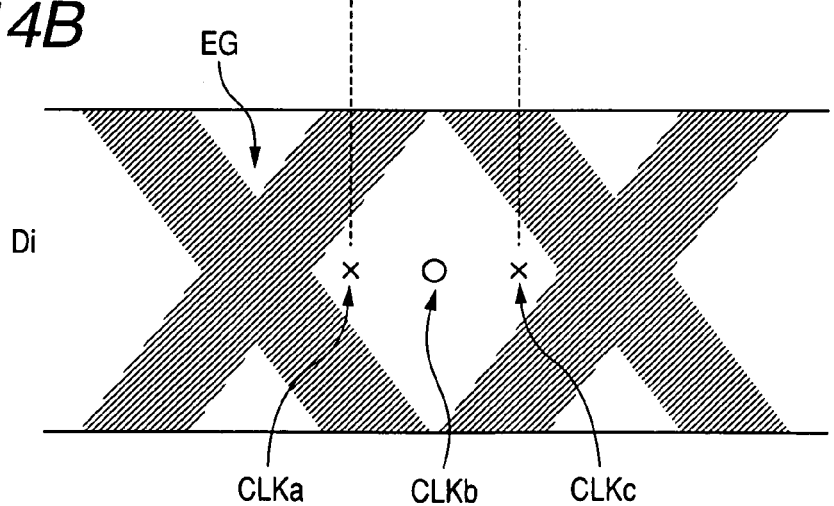

The clock data discriminator unit CD_JGE contains an eye track type phase comparator function and code identification function as described for example in FIG. 13. The clock data discriminator unit CD_JGE processes the receive data signal Di conveyed via the transmission line not shown in the drawing, and outputs a recovery data signal Dr, EARLY signal, and LATE signal. The EARLY signal and the LATE signal are both called phase detection signals. The CD_JGE is not limited to the structure in FIG. 13, and is usable with all types of structures utilizing the eye track method such as described in patent document 1 and reference document 1.

The averaging unit FIL_BK is for example a digital low-pass filter. The averaging unit FIL_BK outputs a clock phase control signal Sph towards the clock generator unit CLK_GEN after averaging the number of times the EARLY signal and LATE signal occur. The averaging unit FIL_BK in other words counts the respective total number of EARLY and LATE signals during each period based for example on units made up of fixed periods, and issues a phase shift command corresponding to the signal that occurred more often.

The clock generator unit CLK_GEN generates the three-phase clock signals CLKa, CLKb, and CLKc. The CLKa and CLKc are phase comparison clock signals as already described using FIG. 13. The CLKb is a code identification clock signal. The CLKb is also a recovery clock signal. The CLK_GEN controls the overall phase (standard phase) of the CLKa, CLKb, and CLKc according to the clock phase control signal Sph while maintaining a mutual phase differential.

The window width control unit WW_CTL generates a window width control signal Sww for regulating the eye track window width, and outputs it (Sww) to the CLK_GEN. The eye track window width is the width between the two clock signal edges, and is the width for judging whether or not there is a receive data signal Di switching edge between those two edges. More specifically, as described in FIG. 13, the eye track window width is the phase differential between CLKa and CLKc, or is the CLKb and CLKa phase differential as well as the CLKb and CLKc phase differential. The CLK_GEN receives this window width control signal Sww, and controls the mutual phase differential of each of the clock signals CLKa, CLKb, CLKc. Restated in other words, the CLK_GEN controls the phase differential between the standard phase and each of the clock signals CLKa, CLKb, CLKc.

Figure 2:
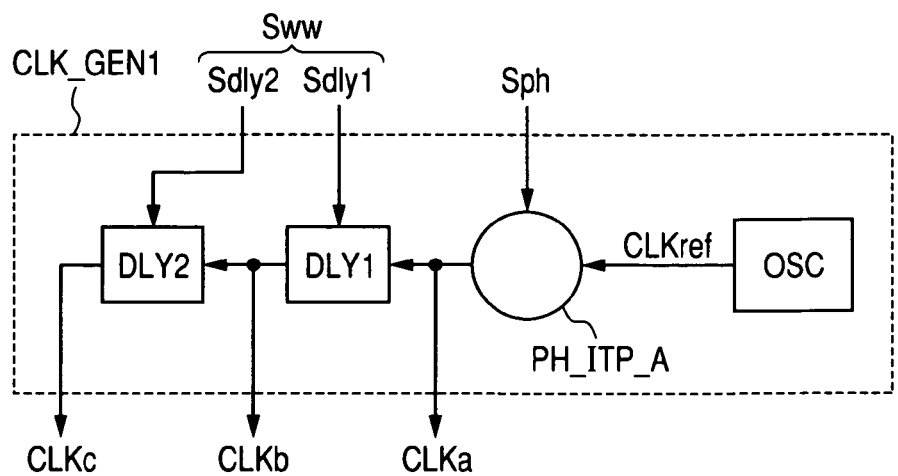
FIG. 2 is a block diagram showing in detail the structure of the clock generator unit of FIG. 1.
Figure 3A:
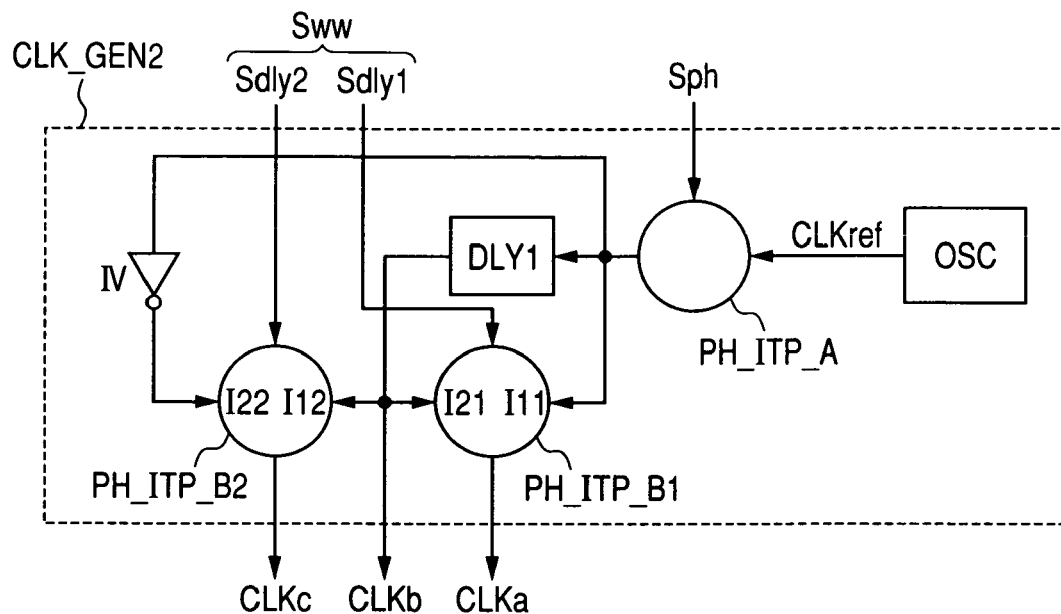
FIG. 3A is a block diagram showing the detailed structure.
Figure 3B:
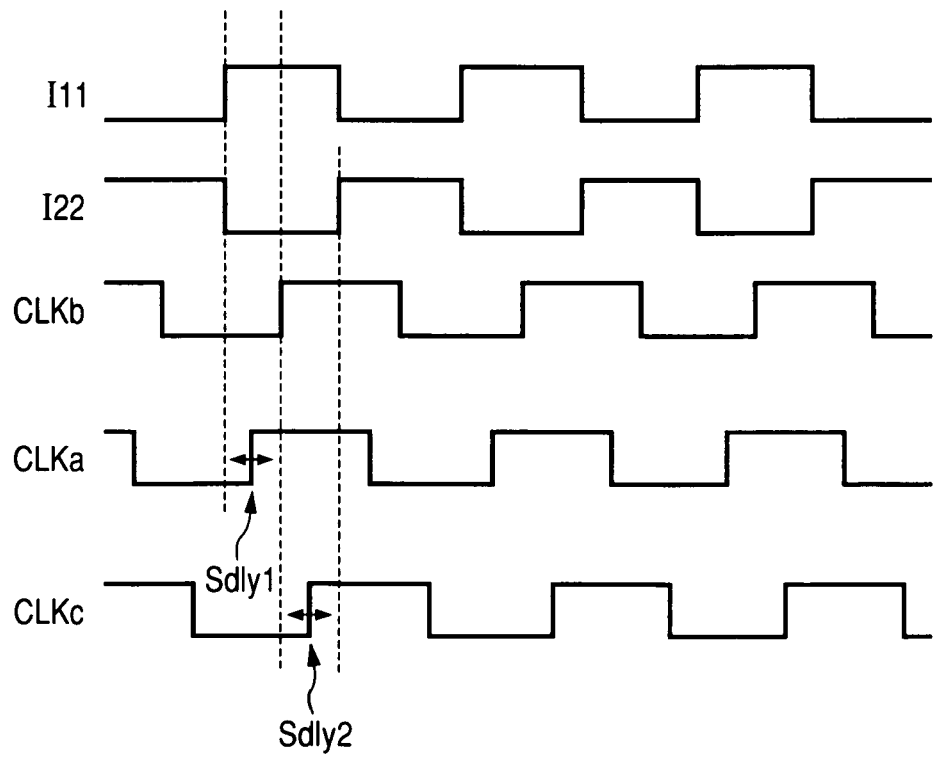
FIG. 3B is a timing chart for describing the operation in FIG. 3A.
Figure 4A:
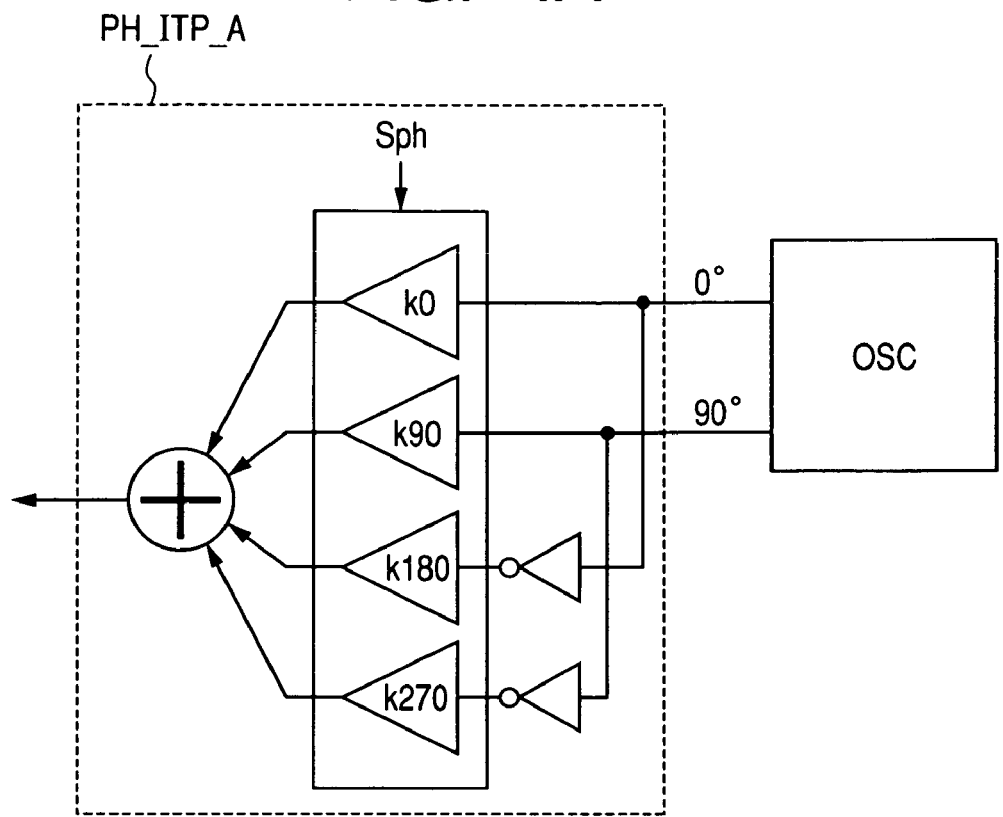
FIG. 4A and 4B are concept views showing the respectively different structures.
Figure 4B:
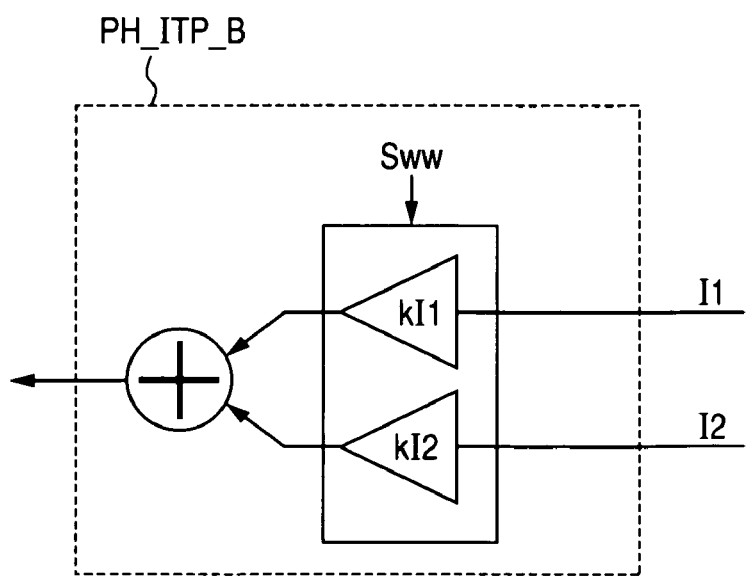

FIG. 2 is a block diagram showing in detail the structure of the clock generator unit CLK_GEN of FIG. 1. FIG. 3 is a drawing showing another example of the clock generator unit CLK_GEN of FIG. 1. FIG. 3A is a block diagram showing the structure in detail. FIG. 3B is a timing chart for describing the operation in FIG. 3A. FIG. 4 is a drawing showing one example of the phase interpolation circuits PH_ITP_A, PH_ITP_B in FIG. 2 and FIG. 3. FIGS. 4A and 4B are concept views showing respectively different structures.

The clock generator unit CLK_GEN1 shown in FIG. 2 contains an oscillator circuit OSC, a phase interpolation circuit PH_ITP_A, and the variable delay circuits DLY1, DLY2. The OSC generates the standard clock signal CLKref and outputs it to the PH_ITP_A. The PH_ITP_A changes the CLKref phase in a range between 0 and 360 degrees, based on the above described clock phase control signal Sph. The PH_ITP_A generates a clock signal containing the desired phase by interpolating the adjacent phases by utilizing a CLKref including phases a 0 degrees, 90 degrees, 180 degrees, and 270 degrees as shown for example in FIG. 4A. To generate a clock signal with a phase of 45 degrees for example, summing is performed after assigning 0 degrees and 90 degrees of the CLKref the same weight (namely, slopes are set equal at the same drive potential); and when generating 0 to 45 degree clock signals, summing is performed after weighting 0 degrees larger than 90 degrees. The clock phase control signal Sph may set these weightings.

The PH_ITP_A outputs the clock whose phase has now been changed in this way as the clock signal CLKa. A variable delay circuit DLY1 delays the clock signal CLKa based on the already described window width control signal Sww (Sdly1), and outputs the clock signal CLKb. A variable delay circuit DLY2 delays the clock signal CLKb based on the window width control signal Sww (Sdly2) and output the clock signal CLKc. When for example controlling the CLKa and CLKc phase differential as the window width, then the DLY1 and DLY2 are controlled by the same Sww (in other words, Sdly1=Sdly2) to be the same delay time. On the other hand, when controlling the CLKb and CLKa phase differential as well as the CLKb and CLKc phase differential as the window width, then the DLY1 and DLY2 are controlled by separate Sww (in other words, independent control of Sdly1 and Sdly2) to reach an optimal delay time.

The clock generator unit CLK_GEN2 shown in FIG. 3A on the other hand, contains an oscillator circuit OSC, and three phase interpolation circuits PH_ITP_A, PH_ITP_B1, PH_ITP_B2, and an inverter circuit IV, and a delay circuit DLY, etc. The phase Interpolation circuit PH_ITP_A is the structure already described in FIG. 4A. The PH_ITP_A changes the standard clock signal CLKref phase from the OSC, in a range between 0 and 360 degrees based on the above described clock phase control signal Sph, and then outputs a signal.

The output signal from this PH_ITP_A becomes the clock signal CLKb by way of the delay circuit DLY. The phase interpolation circuit PH_ITP_B1 receives the CLKb and the signal output from PH_ITP_A, and performs phase interpolation based on window width control signal Sdly1 (Sww) and outputs those results as the clock signal CLKa. The phase interpolation circuit PH_ITP_B2 receives the CLKb and the output signal from PH_ITP_A that was inverted by the inverter circuit IV, performs interpolation based on the window width control signal Sdly2 (Sww), and outputs those results as the clock signal CLKc. The phase interpolation circuits PH_ITP_B1 and PH_ITP_B2 assign weights to these two input signal I1, I2 based on these window width control signals Sww, and sums and outputs them.

FIG. 3B shows the operation of the clock generator CLK_GEN2 of FIG. 3A. The PH_ITP_B1 receives the input signal I11 and the CLKb, and outputs results from interpolating the phase in that time, as the CLKa. The PH_ITP_B2 receives the input signal I22 and the CLKb, and outputs results from interpolating the phase in that time, as the CLKb. The window widths of CLKb and CLKa are in this way controlled by using the window width control signal Sdly1; and the window widths of CLKb and CLKc are controlled by the window width control signal Sdly2.

The clock generator unit CLK_GEN2 in FIG. 3A has the advantage of being strongly resistant to PVT (process/voltage/temperature) fluctuations compared to the clock generator unit CLK_GEN1 in FIG. 2. Moreover, in contrast to the structure in FIG. 2 where the window width is set as an absolute value of time; in the structure in FIG. 3A the window width is settable by a relative value according to the cycle time for the CLKref, and so this structure is effective whey) the CLKref frequency is variable (in other words, utilized when the communication speed is variable).

Figure 5:
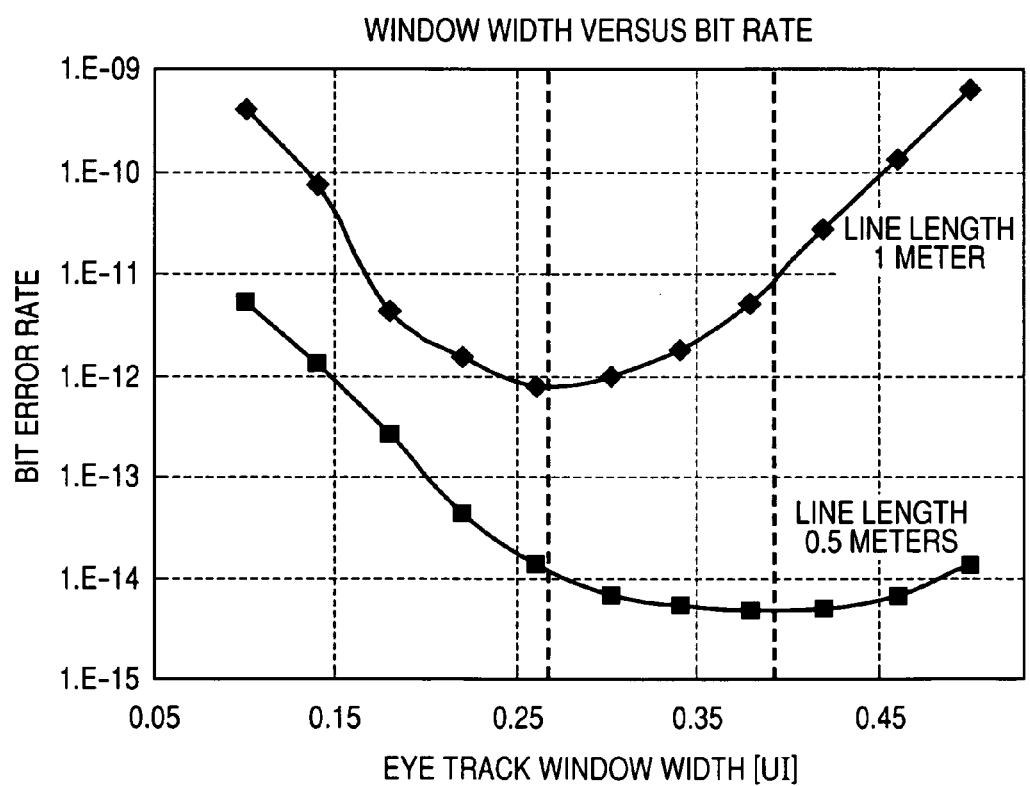
FIG. 5 is a graph showing simulation results for eye track window width versus the bit error rate (BER) utilizing the signal recovery circuit of FIG. 1.

FIG. 5 shows results from simulating the relation between eye track window width and bit error rate (BER) using the signal recovery circuit of FIG. 1. More specifically, this figure shows the respective curves for results from calculating the BER while changing the window width, where the window width is set as the phase-difference of CLKa and CLKc in FIG. 1 and FIG. 2. In one case in the figure the transmission path is a long wire with a length of 1 meter on a glass epoxy substrate (where jitter is large), and in another case is a short wire length of 0.5 meters (where jitter is small) on the same substrate.

As shown in FIG. 5, the BER is lowest at a certain point and then becomes higher when the window width has widened under each transmission path condition. Therefore the point where this BER is lowest is basically the point where the window width is the optimal value. Comparing each transmission path shows that this optimal value for window width changes according to the transmission path length such that a longer transmission path (when loss is large, and pattern jitter is large) yields a smaller optimal value than when the transmission path is small (when loss is small, and pattern jitter is small).

If the BER is regarded as satisfactory when at or below a reference value, then the obtainable window width as shown in FIG. 5 is present over a comparatively wide range. However using the above described optimal value within this range as the window value, allows setting a margin relative to this BER reference value, and expanding the receive margin. Utilizing a clock data recovery circuit containing a mechanism capable of setting the window width as shown in FIG. 1 and FIG. 2 therefore allows setting the variable window width at or extremely close to the optimal value for each transmission path even in cases where the applicable circuit is connected to transmission paths of different lengths used in various transmission systems.

More specifically, the above described window width control unit WW_CTL of FIG. 1 includes a function to generate a window width control signal Sww, after receiving by external input a setting value matching the transmission path length or includes various types of internal discriminator mechanisms and a function to generate an optimal Sww based on those discriminator results. In the latter case where the window width control unit WW_CTL includes various types of discriminator mechanisms, the function may generate an optimal Sww according to conditions while making constant discrimination judgments during routine communications in the transmit/receive period; or may generate an optimal Sww in the training period, and while then carrying out routine communications may utilize this Sww generated in the training period, as a fixed value. The training period as referred to here is for example a period where various communication conditions are adjusted while transmitting a specified signal pattern called a training sequence during the communication start-up period in the transmit/receive period. As is widely known, this training period is an interval for making various adjustments such as adjusting the amplifier circuit gain and adjusting the different types of equalizing equipment (filters) etc.

The optimal value for the Sww on a particular transmit path is set primarily in the period for generating the optimal Sww as shown in FIG. 5, so the method for generating the Sww in the training period is preferable in terms of electrical power consumption during normal communication. However, the optimal value for the Sww is likely to fluctuate somewhat due to the external environment (temperature, voltage, etc.) even on identical transmission paths, so in order to boost the receive margin higher, an optimal Sww is preferably generated according to the state while making constant discrimination judgments during routine communications in the transmit/receive period.

Utilizing the signal recovery circuit of the first embodiment expands the receive margin and reduces the bit error rate (BER). Utilizing the first embodiment in this way to set an optional window width allows lowering the device cost and permits the same device to handle diverse transmission systems with different transmission path lengths.

Second Embodiment

Figure 6:
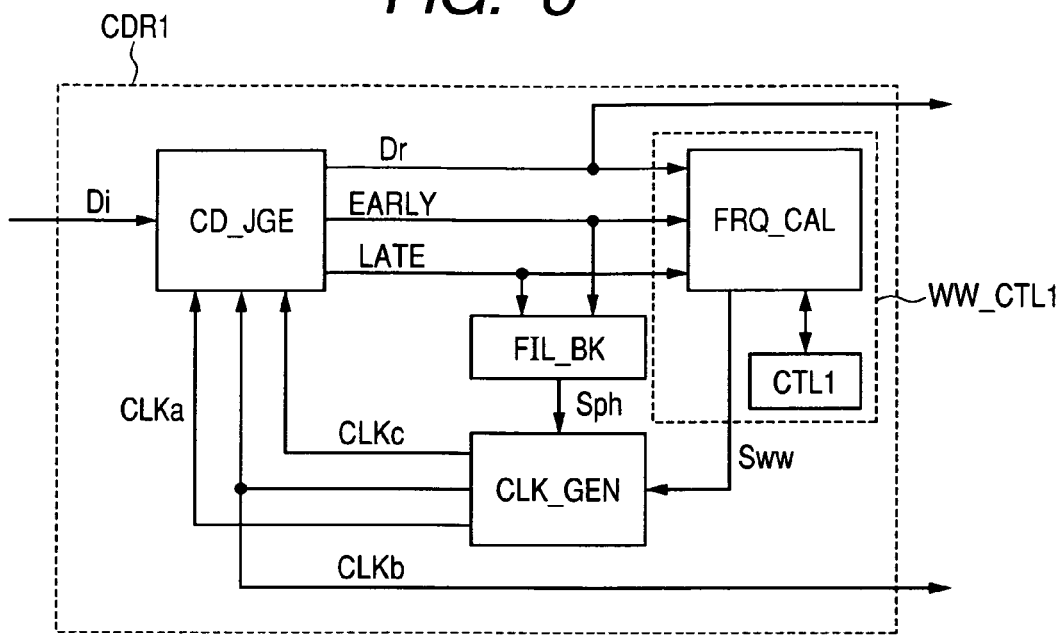
FIG. 6 is a block diagram showing one example of the structure of the signal recovery circuit in the second embodiment of this invention.

The second embodiment is described using a detailed structure of the window width control unit WW_CTL shown in FIG. 1. FIG. 6 is a block diagram showing one example of the structure of the signal recovery circuit in the second embodiment of this invention. The signal recovery circuit (clock data recovery circuit) CDR1 shown in FIG. 6 includes a clock data discriminator unit CD_JGE, an averaging unit FIL_BK, a clock generator unit CLK_GEN, and a window width control unit WW_CTL1, the same as the example in FIG. 1. A unique feature of this window width control unit WW_CTL1 is that it contains a phase detector frequency calculator FRQ_CAL and a controller CTL1.

This phase detector frequency calculator FRQ_CAL receives the phase detector signals (EARLY signal, LATE signal) and recovery data signal Dr, and calculates the frequency (of occurrence) of the EARLY signal and LATE signal (for example, ratio of number of times phase detector signal occurs to number of Dr edges (as parameter)). The FRQ_CAL then searches for an eye track window width (window width control signal Sww value) capable of containing a fixed range where the frequency of occurrences is not too high and not too low, and sets that range in the CLK_GEN. The controller CTL1 regulates the overall operation of this type of FRQ_CAL. This FRQ_CAL can be operated during routine communication period at send/receive, or the training period or in both periods. The controller CTL1 may also be given a selector function to select this operating period.

Figure 7:
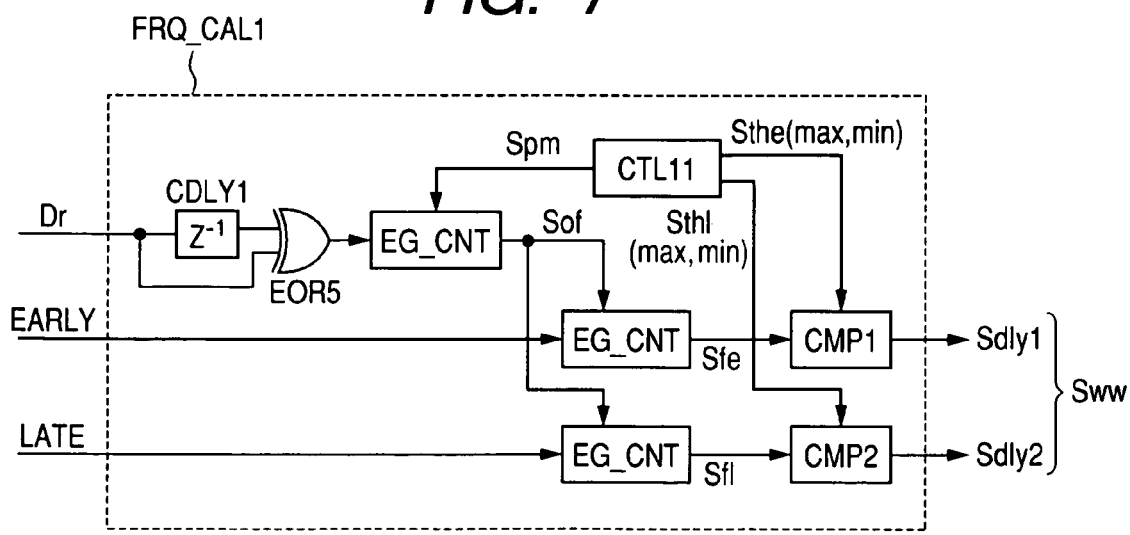
FIG. 7 is a block diagram showing in detail the structure of the phase detector frequency calculator unit in FIG. 6.

FIG. 7 is a block diagram showing in detail the structure of the phase detector frequency calculator unit FRQ_CAL1 in FIG. 6. The phase detector frequency calculator FRQ_CAL shown in FIG. 7, contains a 1-cycle delay circuit CDLY1, an EXOR circuit EOR5, an edge counter circuit EG_CNT, an early counter circuit E_CNT, a late counter circuit L_CNT, a comparator circuit CMP1, CMP2, and a controller CTL11.

The EOR5 makes an exclusive-or (EXOR) decision using (as inputs) the recovery data signal Dr, and the signal arriving via the CDLY1 which is the 1-cycle previous Dr. Namely, the EOR5 outputs an 'H' pulse when there is a signal switching edge in the Dr. The edge counter circuit EG_CNT counts the number of times this 'H' pulse occurs from the EOR5. The parameter setting signal Spm from CLT11 decides the upper threshold value of the count at this time, and the EG_CNT outputs an overflow signal Sof when this upper threshold value is reached. When the signal Sof is output this EG_CNT then resets the count to zero and restarts the count again.

The early counter circuit E_CNT counts the number of times the EARLY signal occurs and, the late counter circuit L_CNT, counts the number of times the LATE signal occurs. When an overflow signal Sof is output from EG_CNT, the E_CNT outputs its own count value at that time, as the EARLY frequency of occurrence signal Sfe. When an Sfe has been output, the E_CNT then returns the count value to zero and restarts the count again. Likewise, when the EG_CNT has output an Sof, the L_CNT outputs its own count value at that time as the LATE frequency of occurrence signal Sfl and returns the count value to zero and restarts the count again.

The comparator circuit CMP1 compares the preset EARLY upper threshold setting signal Sthe (max) and lower threshold setting signal Sthe (min) by CTL11, and the aforementioned EARLY frequency of occurrence signal Sfe. The comparator circuit CMP1 then outputs an EARLY window width control signal Sdly1 to fit the EARLY signal frequency of occurrence in the period between these upper threshold and lower threshold values. More specifically, the CMP1 narrows the EARLY window width (namely, the interval between CLKa and CLKb in FIG. 13) when the frequency of occurrence was higher than the upper threshold value; and widens the EARLY window width when lower than the lower threshold value as shown in FIG. 13.

The comparator circuit CMP2 in the same way compares the preset LATE upper threshold setting signal Sthl (max) and the lower threshold setting signal Sthl (min) by CTL11, and the LATE frequency of occurrence signal Sfl. The comparator circuit CMP2 then outputs a LATE window width control signal Sdly2 to fit the LATE signal frequency of occurrence between these upper and lower threshold values. More specifically, the CMP2 narrows the LATE window width (namely, the interval between CLKb and CLKc in FIG. 13) when the frequency of occurrence was higher than the upper threshold value; and widens the LATE window width when lower than the lower threshold value.

Further, assuming the EARLY signal or LATE signal is too far to one side of the eye pattern then the averaging unit FIL_BK in FIG. 6 uses a clock phase control signal Sph to return all the clock signals CLKa, CLKb, CLKc to the center of the eye. The EARLY and the LATE window widths and the code identification clock signal (CLK in FIG. 13) can consequently be set to optimal positions by achieving a balance between control based on this clock phase control signal Sph, and control based on each of the window width control signals (Sdly1, Sdly2). Optimizing the respective window widths allows expanding the receive margin as described in FIG. 5.

Moreover, the position of the code identification clock signal can be optimized by setting the EARLY and the LATE window widths separately. In other words, in cases such as where there is a disparity between the data signal pulse rise time and pulse fall time due to the communication method and communication environment, then the exact center between the front edge and the rear edge of the data signal might not necessarily be the maximum amplitude value. In these type of cases, utilizing a structure as shown in FIG. 7 in order to set an optimal window width and an optimal code identification clock signal position according to each type of eye pattern, allows a wider receive margin.

Utilizing the signal recovery circuit of the second embodiment therefore yields an expanded receive margin and a reduced bit error rate (BER). Moreover this circuit can be flexibly used with various communication methods and communication environments because the EARLY window width and the LATE window widths can be set separately. The threshold values setting signals Sthe, Sthl or the parameter setting signal Spm described above are preferably set to optional values for flexibility but needless to say a fixed value may also be used.

Third Embodiment

Figure 8:
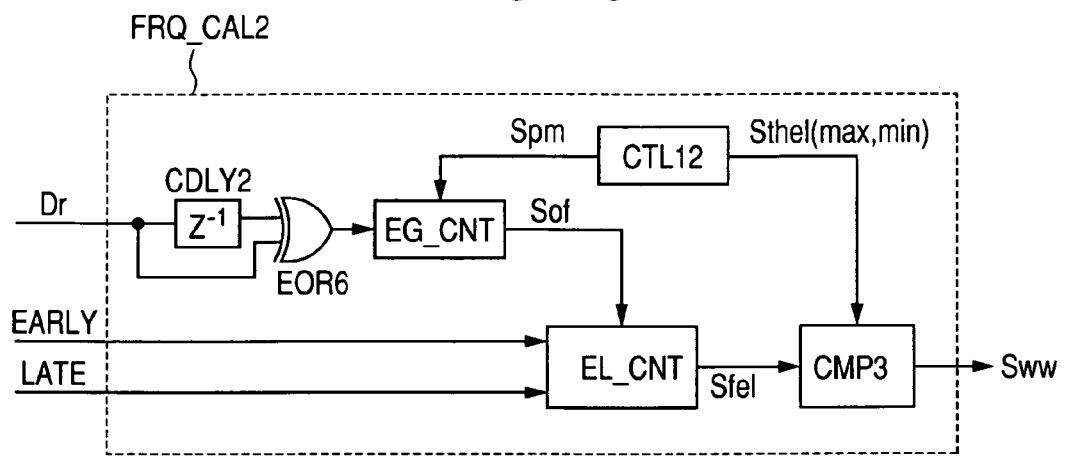
FIG. 8 is a block diagram showing in detail the structure of the phase detector frequency calculator unit in FIG. 6, for the signal recovery circuit of the third embodiment of this invention.

The third embodiment is a variation of the phase detector frequency calculator unit FRQ_CAL1 in FIG. 7 as described in the second embodiment. FIG. 8 is a block diagram showing in detail the structure of the phase detector frequency calculator unit FRQ_CAL of FIG. 6, for the signal recovery circuit of the third embodiment of this invention. The phase detector frequency calculator unit FRQ_CAL2 shown in FIG. 8 includes a 1-cycle delay circuit CDLY2, an EXOR circuit EOR6, an edge counter circuit EG_CNT, an EARLY-LATE counter circuit EL_CNT, a comparator circuit CMP3, and a controller CTL12.

The EOR6 the same as the case in FIG. 7, makes an EXOR decision by using the recovery data signal Dr and the signal via the CDLY2 as the 1-cycle prior Dr as the input signals, and then outputs an "H" pulse when there is a switching edge in the Dr signal. The EG_CNT counts the number of times the "H" pulse occurs from this EOR6 the same as the case in FIG. 7. Also in this case, the parameter setting signal Spm from the controller CTL12 decides the upper threshold value of the count, and the EG_CNT outputs an overflow signal Sof when this upper threshold value is reached. When the signal Sof is output, the EG_CNT then resets the count to zero and restarts the count.

The EARLY-LATE counter circuit EL_CNT counts the total number of times the EARLY and LATE signals occur. The EL_CNT outputs its own count value as the EARLY-LATE frequency of occurrence signal Sfel when the EG_CNT outputs an overflow signal Sof. When this Sfel was output, the EL_CNT then sets the count value to zero and restarts the count again. The comparator circuit CMP3 compares the upper threshold setting signal Sthel (max) and the lower threshold setting signal Sthel (min) that were preset by the controller CTL12, and the aforementioned EARLY-LATE frequency of occurrence signal Sfel and, outputs the window width control signal Sww in order to fit the phase detection signal (EARLY signal+LATE signal) between this upper threshold value and lower threshold value. More specifically, the CMP3 narrows the window width (namely, the interval between CLKa and CLKc in FIG. 13) when the frequency of occurrence was higher than the upper threshold value; and widens the window width when lower than the lower threshold value.

Unlike the case in FIG. 7, utilizing this structure adjusts the CLKa and CLKc period, with the code identification CLKb at a position always in the center between the CLKa and CLKc in FIG. 13. The example in FIG. 8 does not discriminate between the EARLY signal occurring and the LATE signal occurring but even assuming that the EARLY signal or LATE signal nave occurred towards one side of the eye pattern, the clock phase control signal Sph from the averaging unit FIL_BK in FIG. 6 controls all the clock signals CLKa, CLKb, and CLKc. Consequently an optimal window width can be set at a position so that the window is not too far to the front edge or rear edge of the data signal.

The signal recovery circuit of the third embodiment therefore yields an expanded receive margin and a reduced bit error rate (BER). This embodiment also takes up a smaller surface area than the structure shown in FIG. 7 for the second embodiment. The threshold values setting signals Sthel or the parameter setting signal Spm described above are preferably set to optional values for flexibility but needless to say a fixed value may also be used.

Fourth Embodiment

Figure 9:
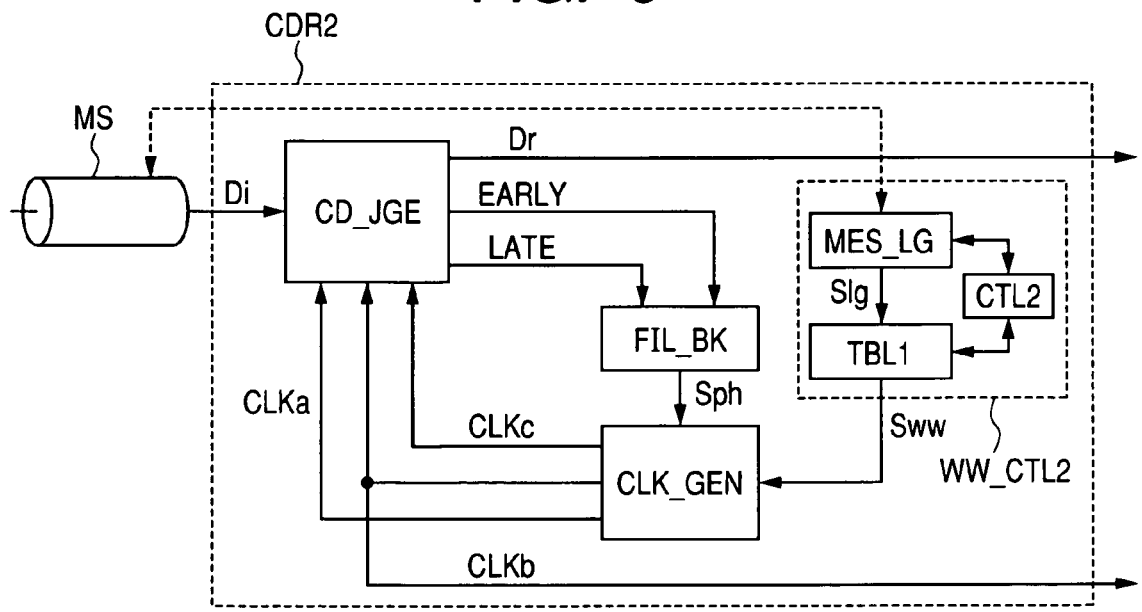
FIG. 9 is a block diagram showing one example of the structure of the signal recovery circuit of the fourth embodiment of this invention.

In the fourth embodiment, the window width control unit WW_CTL shown in FIG. 1 is a different structure than described in the first through third embodiments. FIG. 9 is a block diagram showing one example of the structure of the signal recovery circuit of the fourth embodiment of this invention. The signal recovery circuit (clock data recovery circuit) CDR2 includes a clock data discriminator unit CD_JGE, and an averaging circuit FIL_BK, a clock generator unit CLK_GEN, and a window width controller unit WW_CTL2, the same as the example in FIG. 1. The window width control unit WW_CTL2 is characterized in containing a transmission path length measurement unit MES_LG and table TBL1 and controller CTL2.

The transmission path length measurement unit MES_LG measures the path length of the transmission path MS for sending the receive data signal Di from a transmit circuit not shown in the figure towards the clock data discriminator unit CD_JGE forming a portion of the receive circuit. Though there are no particular restrictions, the MES_LG can measure the already known signal amplitude at the transmit end of the transmit path MS and the signal amplitude detected at the receive end by two methods. One method applies a pulse signal from one of either the transmit end or receive end and makes a calculation by utilizing that transmission loss. The other method calculates the distance by a method using the time required for that pulse signal to fully reflect from the other side and return.

The table TBL1 is implemented by converter circuits such as memories or decoders. The table TBL1 contains a function to output an eye track window width matching the path length of the transmission path MS. In other words, the Table TBL1 receives a measurement result signal Slg from the MES_LG for expressing the path length, and outputs a window width control signal Sww expressing a value for setting the window width. More specifically, the Table TBL1 changes the window to a narrower width as the path length becomes longer. The controller CTL2 controls the entire process by utilizing this MES_LG and TBL1.

The signal recovery circuit of the fourth embodiment therefore yields an expanded receive margin and a reduced bit error rate (BER). Moreover a smaller surface area can be ensured by incorporating the transmission path length measurement unit MES_LG in advance into the receive circuit. If using the structure of FIG. 9, then the EARLY window width and the LATE window width may be defined with identical values in Table TBL1, or may be defined as different values at a specified ratio.

Fifth Embodiment

Figure 10:
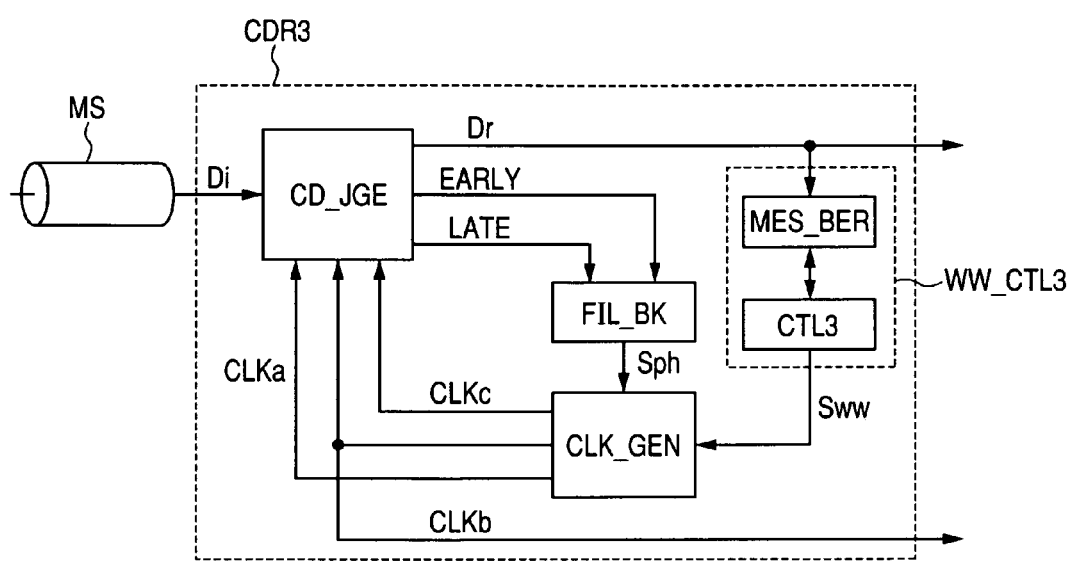
FIG. 10 is a block diagram showing one example of the structure of the signal recovery circuit of the fifth embodiment of this invention.

In the fifth embodiment, the window width control unit WW_CTL shown in FIG. 1 is a different structure than that described in the first through fourth embodiments. FIG. 10 is a block diagram showing one example of the structure of the signal recovery circuit of the fifth embodiment of this invention. The clock signal recovery circuit (clock data recovery circuit) CDR3 shown in FIG. 10 includes a clock data discriminator unit CD_JGE, an averaging unit FIL_BK, a clock generator unit CLK_GEN, and a window width control unit WW_CTL3, the same as the example in FIG. 1. A unique feature of this window width control unit WW_CTL3 is that it contains a bit error rate measurement unit MES_BER and a controller CTL3.

The bit error rate measurement unit MES_BER for example contains a function to measure the bit error rate (BER) by comparing it with an expectation value, after receiving a receive data signal Di sent from a transmission circuit not shown in the drawing by way of the transmission path MS during the training period and that reflects the data pattern expectation value. The controller CTL3 changes the window width by outputting the window width control signal Sww to the clock generator unit CLK_GEN, and operating the MES_BER accordingly to measure the BER. By way of this processing, the controller CTL3 searches for and sets a BER for the window width that is smaller than the specified value.

Unlike the above function, the bit error rate measurement unit MES_BER may contain a function to monitor the quantity of receive data, and a function to identify error detection codes. Communication devices in many cases receive error detection/correction codes (for example CRC codes, etc.) in the data sent from the transmit circuit. In those cases, the bit error rate measurement unit MES_BER detects errors by identifying the coded segments in this type of transmit data, and measures the BER by way of the ratio with the receive data. This measurement can be made during training and/or during normal communication operation. The controller CTL3 changes the window width by outputting the window width control signal Sww to the clock generator unit CLK_GEN, and operating the MES_BER accordingly to measure the BER. By way of this processing, the controller CTL3 searches for and sets a window width whose BER is smaller than the specified value.

The signal recovery circuit of the fifth embodiment therefore yields an expanded receive margin and a reduced bit error rate (BER). The circuit of this embodiment is further capable of control to maintain a precise BER which allows direct BER measurement. The structure in FIG. 10 may be utilized to allow the controller CTL3 to change the window width to constantly maintain the EARLY and LATE window width at the same value, or may be utilized to change the window width to maintain a specified ratio.

Sixth Embodiment

Figure 11A:
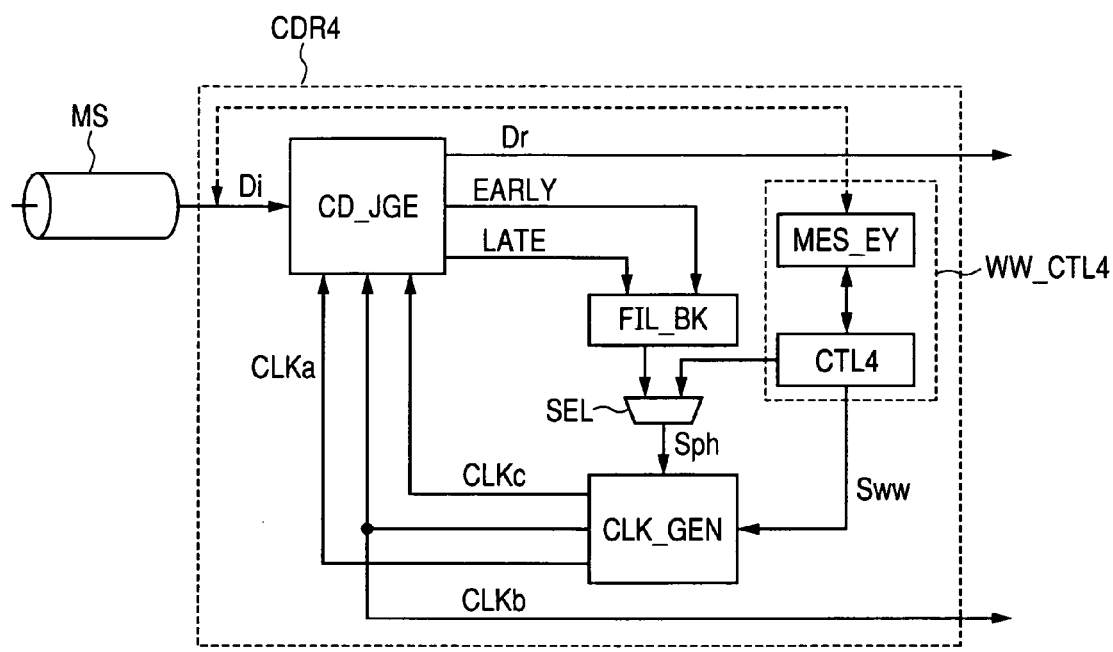
FIG. 11A is a block diagram showing the structure.
Figure 11B:
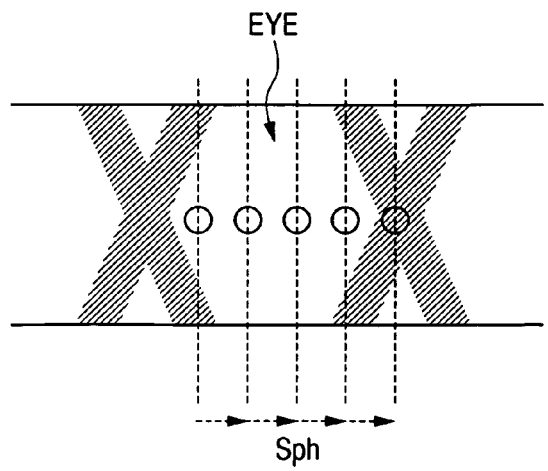
FIG. 11B is a drawing for describing the operation in FIG. 11A.

In the sixth embodiment, the window width control unit WW_CTL shown in FIG. 1 is a different structure than that described in the first through fifth embodiments. FIG. 11 is drawings showing the signal recovery circuit of the sixth embodiment of this invention. FIG. 11A is a block diagram showing the structure. FIG. 11B is a drawing for describing the operation in FIG. 11A. The signal recovery circuit (clock data recovery circuit) CDR4 shown in FIG. 11 includes a clock data discriminator unit CD_JGE, an averaging unit FIL_BK, and a clock generator unit CLK_GEN, and a window width control unit WW_CTL4, the same as the example in FIG. 1, and moreover a selector SEL has been added. A unique feature of this window width control unit WW_CTL4 is that it contains an eye aperture width measurement unit MES_EY, and a controller CTL4.

During the training period, the eye aperture width measurement unit MES_EY monitors the receive data signal Di (for example, a pseudo-random pattern showing the expectation value in advance) sent from a transmit circuit not shown in the drawings and input by way of the transmit path MS, and then measures the aperture width of that EYE. More specifically, the MES_EY unit may for example stop the phase comparison (in other words, generating an EARLY signal/LATE signal) by the clock data discriminator unit CD_JGE as shown in FIG. 13, and judge whether or not the recovery data signal Dr latched by the CLKb matches the expectation value. By sequentially outputting clock phase control signals Sph having respectively different values to the CLK_GEN via the SEL at this time, the CTL4 can scan the CLKb at fixed intervals as shown in FIG. 11B and the MES_EY unit may then judge the expectation value according to that scan. The aperture width of the EYE is measured in this way.

The CTL4 generates the window width control signal Sww according to results from measuring the EYE aperture width, and sets the CLK_GEN. The CTL4 may then set the SEL input in the FIL_BK and perform the regular communication operations. The structure of this eye aperture width measurement unit MES_EY is of course not limited to the above description and may for example be substituted by general items of the known art such as jitter measurement circuits. In other words, if the jitter component can be identified then the EYE aperture width can be found by the difference versus the already identified 1-bit time width. Methods known in the art for detecting the jitter component via jitter measurement circuits include detecting the jitter component via the difference between the maximum value and the minimum value for the voltage from a circuit that generates a voltage proportional to the time differential between the clock signal edge and the data signal edge; and a method for detecting the jitter component by utilizing different multi-stage flip flops that latch the data signal at the latch timing for the specified width.

The signal recovery circuit of the sixth embodiment therefore yields an expanded receive margin and a reduced bit error rate (BER). Moreover a small surface area can be achieved by incorporating the jitter measurement circuit in advance into the receive circuit. The structure in FIG. 11 may be utilized to allow the controller CTL4 to set the window width so as to constantly maintain the EARLY and LATE window width at the same value, or may be utilized to change the window width to maintain a specified ratio.

Seventh Embodiment

Figure 12:
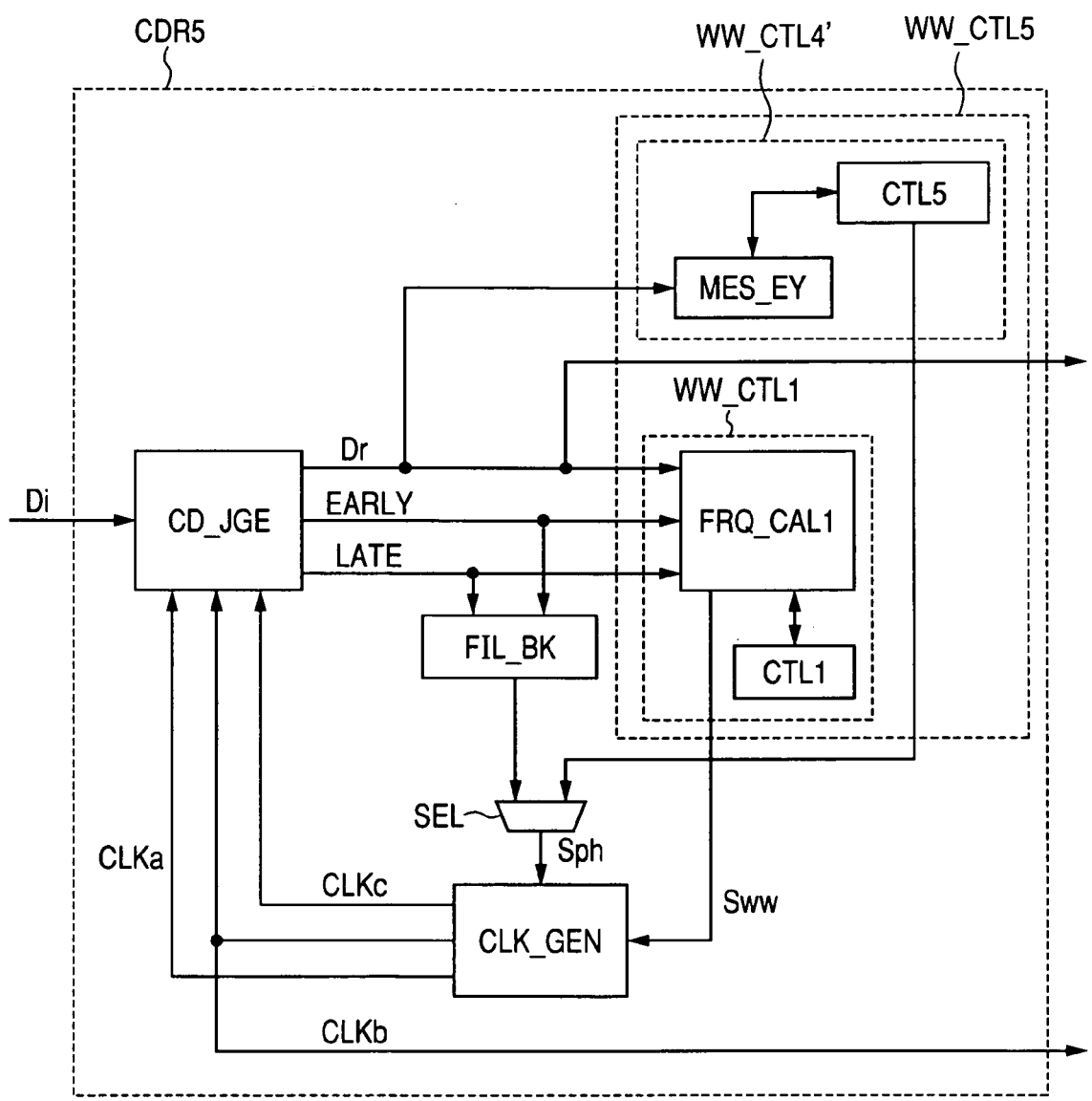
FIG. 12 is a block diagram showing one example of the structure of the signal recovery circuit of the seventh embodiment of this invention.

In the seventh embodiment, the window width control unit WW_CTL shown in FIG. 1 is a different structure than that described in the first through sixth embodiments. FIG. 12 is a block diagram showing an example of the structure of the signal recovery circuit of the seventh embodiment of this invention. The signal recovery circuit (clock data recovery circuit) CDR5 shown in FIG. 12 includes a clock data discriminator unit CD_JGE, an averaging unit FIL_BK, a clock generator unit CLK_GEN, and a window width control unit WW_CTL5, the same as the example in FIG. 1; and moreover a selector SEL has been added. A unique feature of this window width control unit WW_CTL5 is a structure combining the window width control unit WW_CTL1 (phase detector frequency calculator unit FRQ_CAL1) as described in FIG. 6 and FIG. 7 with a window width control unit WW_CTL4' approximately the same as in FIG. 11.

When using the phase detector frequency calculator unit FRQ_CAL1 shown in FIG. 7, and for example the position of clock signal CLKb at the initial position is too far to either of the receive data signal Di edges, then this clock signal CLKb position might tend to concentrate at a position farther away from the eye center than is needed. To resolve this problem the window width control unit WW_CTL4 as shown in FIG. 11 can be utilized to preset the clock signal CLKb initial position in advance near the center of the EYE, and then operating the WW_CTL to adjust the clock signals CLKa, CLKb, CLKc.

Namely, in the training period with the WW_CTL1 stopped, the WW_CTL4' measures the aperture width of the EYE by a method such as described in FIG. 11; and the controller CTL5 within the WW_CTL4' uses the SEL to set a clock phase control signal Sph in the CLK_GEN (unit) for positioning the CLKb near the center of the aperture width. Next, the WW_CTL4' is stopped, the SEL input switches to the FIL_BK side, and the initial position for CLKb used by the above described WW_CTL4 is operated as WW_CTL1. An optimal setting is in this way made for the CLKb position and, the window width between the CLKa and CLKb positions, and the window width between the CLKb and CLKc positions. Routine communication is then carried out while maintaining this setting.

The signal recovery circuit of the seventh embodiment therefore yields an expanded receive margin and a reduced bit error rate (BER). Moreover the seventh embodiment can flexibly match different types of communication methods and communication environments by setting the EARLY window width and the LATE window widths separately.

This invention was described above in detail based on the embodiments contrived by the inventors. However the present invention is not limited by the above embodiments, and all manner of changes or adaptations not departing from the spirit and scope of the invention are allowable.

In the above embodiments for example, three-phase clock signals (CLKa, CTKb, CLKc) were utilized to control the window width. Applying a method called the half-rate system to the embodiments as described in FIG. 4 for reference document 1 is even more satisfactory and has a smaller overhead per surface area because the half rate system fundamentally uses a three-phase clock signal. The half rate system as described here is a system that cuts the clock signal frequency by half, to lower the power consumption by utilizing the rising edge of either of 2-cycle three-phase clock continuous signals, and the falling edge of the other clock signal for phase comparison processing, etc.

On the other hand, in the method called the full rate system as described in FIG. 2 of reference document 1, the frequency is not cut in half and needless to say, a three-phase clock signal may also be utilized but processing such as phase comparison can be implemented even by using two-phase clock signals. In this case for example, the code identifier clock signal (CLKb) may be utilized for the rising edge of the first phase clock signal, and the phase comparison clock signals (CLKa, CLKc) may be utilized for the rising edge and the falling edge of the second phase clock signal. Control becomes complicated when applying this type of two-phase clock signal to the embodiments but can be achieved by a structure that adjusts the phase differential between the first phase and the second phase clock signals; and the period (in other words, the duty of the second phase of the clock signal) between CLKa and CLKc.

The signal recovery circuit of these embodiments can also be widely applied to serial transmit systems for recovering clock signals and/or data signals using the EYE track method. Among such systems, this signal recovery circuit will prove especially effective for high-speed optical transmission systems exceeding several dozen Gbps where there is a strong need for expanded receive margins.

What is claimed is:

1. A signal recovery circuit comprising:
   a clock generator unit to generate a first clock edge, and a second clock edge different from the first clock edge;
   a phase comparator unit to judge if the edge of the data signal that was input has entered into a first window which is the period between the first clock edge and the second clock edge, and to output a phase detection signal if the data signal edge has entered into the first window; and
   a window width control unit to output a window width control signal, wherein the clock generator unit includes:
   a first unit to control the phase of the first clock edge and the second clock edge according to the phase detection signal, while still maintaining the width of the first window so that the data signal edge does not enter within the first window; and
   a second unit to control the width of the first window according to the window width control signal.

2. The signal recovery circuit according to claim 1, wherein the window width control unit includes:
   a frequency calculator circuit to calculate the frequency of occurrence of the phase detection signal, and
   a first circuit to generate the window width control signal so that the frequency of occurrence of the phase detection signals converges on the preset optimal value.

3. The signal recovery circuit according to claim 1, wherein the window width control unit includes a first table to define the interrelation between the first window width, and the length of a transmission path forming input source for the data signal.

4. The signal recovery circuit according to claim 3, wherein the window width control unit further includes a first measurement circuit to measure the length of the transmission path.

5. The signal recovery circuit according to claim 4, wherein the window width control unit includes:
a second measurement circuit to measure the bit error rate of the data signal that was input, and a first circuit to generate the window width control signal to make the bit error rate of the data signal lower than a preset reference value.

6. The signal recovery circuit according to claim 5, wherein, the window width control unit operates during the training period.

7. The signal recovery circuit according to claim 5, wherein the window width control unit includes a third measurement circuit to measure the aperture width of the eye for the receive data that was input, and generates the window width control signal according to those measurement results.

8. The signal recovery circuit according to claim 7, wherein the window width control unit operates during the training period.

9. A signal recovery circuit comprising:
a clock generator unit to generate a first clock edge, a second clock edge whose phase is earlier than the first clock edge, and a third clock edge whose phase is delayed more than the first clock edge;
a phase comparator unit to judge if the edge of the data signal that was input has entered within a first window which is the period between the first clock edge and the second clock edge, and output a first phase detection signal if the data signal edge has entered within the first window; and
further to judge if the edge of the data signal has entered within a second window which is the period between the first clock edge and the third clock edge, and output a second phase detection signal if the data signal edge has entered within the second window; and
a window width control unit to output a first window width control signal and a second window width control signal,
wherein the clock generator unit includes:
a first unit to control the phase of the first, the second and the third clock edge while maintaining the width of the first and the second window according to the first phase detection signal so that the edge of the data signal does not enter within the first window; and
to control the phase of the first, the second and the third clock edge while maintaining the first and the second window width according to the second phase detection signal so that the edge of the data signal does not enter within the second window; and
a second unit to control the first window width according to the first window width control signal and to control the second window width according to the second window width control signal.

10. The signal recovery circuit according to claim 9, wherein the window width control unit includes:
a first frequency calculator circuit to calculate the frequency of occurrence of the first phase detection signal, a second frequency calculator circuit to calculate the frequency of occurrence of the second phase detection signal, a first circuit to generate the first window width control signal so that the frequency of occurrence of the first phase detection signal is within a preset first range, and a second circuit to generate the second window width control signal so that the frequency of occurrence of the second phase detection signal is within a preset second range.

11. The signal recovery circuit according to claim 10, which, includes a window width control unit, further comprising:
a first measurement circuit to measure the aperture width of the eye of the receive data that was input, a third circuit to set the first clock edge in the vicinity of the aperture width of the eye measured by the first measurement circuit,
wherein the first and the second frequency calculation circuits, and the first and the second circuits operate with the first clock edge position set by the third circuit as the initial state.

12. The signal recovery circuit according to claim 10, wherein the window width control unit includes:
a third frequency calculator circuit to calculate the total frequency of occurrences of the first phase detection signal and the second phase detection signal, and a third circuit to generate the first and the second window width control signal to make the first window width and the second window width equal so that the total frequency of occurrences is within a preset third range.

\* \* \* \* \*